US008314893B2

(12) United States Patent
Ravi

(10) Patent No.: US 8,314,893 B2
(45) Date of Patent: Nov. 20, 2012

(54) REMOTE CONTROL AND METHOD FOR AUTOMATICALLY ADJUSTING THE VOLUME OUTPUT OF AN AUDIO DEVICE

(75) Inventor: Deepak Malode Ravi, Karnataka (IN)

(73) Assignee: Sling Media Pvt. Ltd., Bangalore (IN)

( * ) Notice: Subject to any disclaimer, the term of this patent is extended or adjusted under 35 U.S.C. 154(b) by 537 days.

(21) Appl. No.: 12/550,145

(22) Filed: Aug. 28, 2009

(65) Prior Publication Data

US 2011/0051016 A1 Mar. 3, 2011

(51) Int. Cl.
H04N 5/44 (2011.01)
H03G 3/20 (2006.01)
H03G 3/00 (2006.01)
H03G 7/00 (2006.01)

(52) U.S. Cl. .......... 348/734; 348/632; 381/57; 381/107; 381/105

(58) Field of Classification Search .................. 348/734, 348/632, 738; 381/57, 104, 107, 92, 111, 381/56, 105
See application file for complete search history.

(56) References Cited

U.S. PATENT DOCUMENTS

| 3,416,043 | A | 12/1968 | Jorgensen |
| 4,254,303 | A | 3/1981 | Takizawa |
| 5,161,021 | A | 11/1992 | Tsai |
| 5,237,648 | A | 8/1993 | Mills et al. |
| 5,386,493 | A | 1/1995 | Degen et al. |
| 5,434,590 | A | 7/1995 | Dinwiddie, Jr. et al. |
| 5,493,638 | A | 2/1996 | Hooper et al. |
| 5,602,589 | A | 2/1997 | Vishwanath et al. |
| 5,661,516 | A | 8/1997 | Carles |
| 5,666,426 | A | 9/1997 | Helms |
| 5,682,195 | A | 10/1997 | Hendricks et al. |
| 5,706,290 | A | 1/1998 | Shaw et al. |
| 5,708,961 | A | 1/1998 | Hylton et al. |
| 5,710,605 | A | 1/1998 | Nelson |
| 5,722,041 | A | 2/1998 | Freadman |
| 5,757,416 | A | 5/1998 | Birch et al. |
| 5,774,170 | A | 6/1998 | Hite et al. |
| 5,778,077 | A * | 7/1998 | Davidson ................. 381/57 |

(Continued)

FOREIGN PATENT DOCUMENTS

CN 1464685 12/2003

(Continued)

OTHER PUBLICATIONS

Translation of Japanese Patent Publication, JP 2003304590 A, Oct. 2003, Japan.*

(Continued)

*Primary Examiner* — Michael Lee
(74) *Attorney, Agent, or Firm* — Ingrassia Fisher & Lorenz, P.C.

(57) ABSTRACT

Embodiments of a remote control and a method are provided for automatically adjusting the volume output of an audio device, such as a television. In one embodiment, the remote control includes a wireless transmitter configured to transmit command signals to the audio device, a microphone configured to monitor sound levels external to the remote control, a memory storing a first threshold, and a controller. The controller is configured to: (i) determine a signal-to-noise ratio as a function of the sound levels detected by the microphone, and (ii) transmit via the wireless transmitter a first command to adjust the volume output of the audio device if the signal-to-noise ratio passes the first threshold.

15 Claims, 2 Drawing Sheets

U.S. PATENT DOCUMENTS

| | | |
|---|---|---|
| 5,794,116 A | 8/1998 | Matsuda et al. |
| 5,822,537 A | 10/1998 | Katseff et al. |
| 5,831,664 A | 11/1998 | Wharton et al. |
| 5,850,482 A | 12/1998 | Meany et al. |
| 5,852,437 A | 12/1998 | Wugofski et al. |
| 5,880,721 A | 3/1999 | Yen |
| 5,898,679 A | 4/1999 | Brederveld et al. |
| 5,909,518 A | 6/1999 | Chui |
| 5,911,582 A | 6/1999 | Redford et al. |
| 5,922,072 A | 7/1999 | Hutchinson et al. |
| 5,936,968 A | 8/1999 | Lyons |
| 5,968,132 A | 10/1999 | Tokunaga |
| 5,987,501 A | 11/1999 | Hamilton et al. |
| 6,002,450 A | 12/1999 | Darbee et al. |
| 6,008,777 A | 12/1999 | Yiu |
| 6,014,694 A | 1/2000 | Aharoni et al. |
| 6,020,880 A | 2/2000 | Naimpally |
| 6,031,940 A | 2/2000 | Chui et al. |
| 6,036,601 A | 3/2000 | Heckel |
| 6,040,829 A | 3/2000 | Croy et al. |
| 6,043,837 A | 3/2000 | Driscoll, Jr. et al. |
| 6,049,671 A | 4/2000 | Slivka et al. |
| 6,075,906 A | 6/2000 | Fenwick et al. |
| 6,088,777 A | 7/2000 | Sorber |
| 6,097,441 A | 8/2000 | Allport |
| 6,104,334 A | 8/2000 | Allport |
| 6,108,041 A | 8/2000 | Faroudja et al. |
| 6,115,420 A | 9/2000 | Wang |
| 6,117,126 A | 9/2000 | Appelbaum et al. |
| 6,141,059 A | 10/2000 | Boyce et al. |
| 6,141,447 A | 10/2000 | Linzer et al. |
| 6,160,544 A | 12/2000 | Hayashi et al. |
| 6,201,536 B1 | 3/2001 | Hendricks et al. |
| 6,212,282 B1 | 4/2001 | Mershon |
| 6,222,885 B1 | 4/2001 | Chaddha et al. |
| 6,223,211 B1 | 4/2001 | Hamilton et al. |
| 6,240,459 B1 | 5/2001 | Roberts et al. |
| 6,240,531 B1 | 5/2001 | Spilo et al. |
| 6,243,596 B1 | 6/2001 | Kikinis |
| 6,256,019 B1 | 7/2001 | Allport |
| 6,263,503 B1 | 7/2001 | Margulis |
| 6,279,029 B1 | 8/2001 | Sampat et al. |
| 6,282,714 B1 | 8/2001 | Ghori et al. |
| 6,286,142 B1 | 9/2001 | Ehreth |
| 6,310,886 B1 | 10/2001 | Barton |
| 6,340,994 B1 | 1/2002 | Margulis et al. |
| 6,353,885 B1 | 3/2002 | Herzi et al. |
| 6,356,945 B1 | 3/2002 | Shaw et al. |
| 6,357,021 B1 | 3/2002 | Kitagawa et al. |
| 6,370,688 B1 | 4/2002 | Hejna, Jr. |
| 6,389,467 B1 | 5/2002 | Eyal |
| 6,434,113 B1 | 8/2002 | Gubbi |
| 6,442,067 B1 | 8/2002 | Chawla et al. |
| 6,456,340 B1 | 9/2002 | Margulis |
| 6,466,623 B1 | 10/2002 | Youn et al. |
| 6,470,378 B1 | 10/2002 | Tracton et al. |
| 6,476,826 B1 | 11/2002 | Plotkin et al. |
| 6,487,319 B1 | 11/2002 | Chai |
| 6,493,874 B2 | 12/2002 | Humpleman |
| 6,496,122 B2 | 12/2002 | Sampsell |
| 6,505,169 B1 | 1/2003 | Bhagavath et al. |
| 6,510,177 B1 | 1/2003 | De Bonet et al. |
| 6,529,506 B1 | 3/2003 | Yamamoto et al. |
| 6,553,147 B2 | 4/2003 | Chai et al. |
| 6,557,031 B1 | 4/2003 | Mimura et al. |
| 6,564,004 B1 | 5/2003 | Kadono |
| 6,567,984 B1 | 5/2003 | Allport |
| 6,584,201 B1 * | 6/2003 | Konstantinou et al. ......... 381/57 |
| 6,584,559 B1 | 6/2003 | Huh et al. |
| 6,597,375 B1 | 7/2003 | Yawitz |
| 6,598,159 B1 | 7/2003 | McAlister et al. |
| 6,600,838 B2 | 7/2003 | Chui |
| 6,609,253 B1 | 8/2003 | Swix et al. |
| 6,611,530 B1 | 8/2003 | Apostolopoulos |
| 6,628,716 B1 | 9/2003 | Tan et al. |
| 6,642,939 B1 | 11/2003 | Vallone et al. |
| 6,647,015 B2 | 11/2003 | Malkemes et al. |
| 6,658,019 B1 | 12/2003 | Chen et al. |
| 6,665,751 B1 | 12/2003 | Chen et al. |
| 6,665,813 B1 | 12/2003 | Forsman et al. |
| 6,697,356 B1 | 2/2004 | Kretschmer et al. |
| 6,701,380 B2 | 3/2004 | Schneider et al. |
| 6,704,678 B2 | 3/2004 | Minke et al. |
| 6,704,847 B1 | 3/2004 | Six et al. |
| 6,708,231 B1 | 3/2004 | Kitagawa |
| 6,718,551 B1 | 4/2004 | Swix et al. |
| 6,754,266 B2 | 6/2004 | Bahl et al. |
| 6,754,439 B1 | 6/2004 | Hensley et al. |
| 6,757,851 B1 | 6/2004 | Park et al. |
| 6,757,906 B1 | 6/2004 | Look et al. |
| 6,766,376 B2 | 7/2004 | Price |
| 6,768,775 B1 | 7/2004 | Wen et al. |
| 6,771,828 B1 | 8/2004 | Malvar |
| 6,774,912 B1 | 8/2004 | Ahmed et al. |
| 6,781,601 B2 | 8/2004 | Cheung |
| 6,785,700 B2 | 8/2004 | Masud et al. |
| 6,795,638 B1 | 9/2004 | Skelley, Jr. |
| 6,798,838 B1 | 9/2004 | Ngo |
| 6,806,909 B1 | 10/2004 | Radha et al. |
| 6,807,308 B2 | 10/2004 | Chui et al. |
| 6,816,194 B2 | 11/2004 | Zhang et al. |
| 6,816,858 B1 | 11/2004 | Coden et al. |
| 6,826,242 B2 | 11/2004 | Ojard et al. |
| 6,834,123 B2 | 12/2004 | Acharya et al. |
| 6,839,079 B2 | 1/2005 | Barlow et al. |
| 6,847,468 B2 | 1/2005 | Ferriere |
| 6,850,571 B2 | 2/2005 | Tardif |
| 6,850,649 B1 | 2/2005 | Malvar |
| 6,868,083 B2 | 3/2005 | Apostolopoulos et al. |
| 6,889,385 B1 | 5/2005 | Rakib et al. |
| 6,892,359 B1 | 5/2005 | Nason et al. |
| 6,898,583 B1 | 5/2005 | Rising, III |
| 6,907,602 B2 | 6/2005 | Tsai et al. |
| 6,927,685 B2 | 8/2005 | Wathen |
| 6,930,661 B2 | 8/2005 | Uchida et al. |
| 6,941,575 B2 | 9/2005 | Allen |
| 6,944,880 B1 | 9/2005 | Allen |
| 6,952,595 B2 | 10/2005 | Ikedo et al. |
| 6,981,050 B1 | 12/2005 | Tobias et al. |
| 7,016,337 B1 | 3/2006 | Wu et al. |
| 7,020,892 B2 | 3/2006 | Levesque et al. |
| 7,032,000 B2 | 4/2006 | Tripp |
| 7,047,305 B1 | 5/2006 | Brooks et al. |
| 7,110,558 B1 | 9/2006 | Elliott |
| 7,124,366 B2 | 10/2006 | Foreman et al. |
| 7,151,575 B1 | 12/2006 | Landry et al. |
| 7,155,734 B1 | 12/2006 | Shimomura et al. |
| 7,155,735 B1 | 12/2006 | Ngo et al. |
| 7,184,433 B1 | 2/2007 | Oz |
| 7,224,323 B2 | 5/2007 | Uchida et al. |
| 7,239,800 B2 | 7/2007 | Bilbrey |
| 7,344,084 B2 | 3/2008 | DaCosta |
| 7,430,686 B1 | 9/2008 | Wang et al. |
| 7,464,396 B2 | 12/2008 | Hejna, Jr. |
| 7,502,733 B2 | 3/2009 | Andrsen et al. |
| 7,505,480 B1 | 3/2009 | Zhang et al. |
| 7,565,681 B2 | 7/2009 | Ngo et al. |
| 2001/0021998 A1 | 9/2001 | Margulis |
| 2002/0004839 A1 | 1/2002 | Wine et al. |
| 2002/0010925 A1 | 1/2002 | Kikinis |
| 2002/0012530 A1 | 1/2002 | Bruls |
| 2002/0031333 A1 | 3/2002 | Mano et al. |
| 2002/0046404 A1 | 4/2002 | Mizutani |
| 2002/0053053 A1 | 5/2002 | Nagai et al. |
| 2002/0080753 A1 | 6/2002 | Lee |
| 2002/0090029 A1 | 7/2002 | Kim |
| 2002/0105529 A1 | 8/2002 | Bowser et al. |
| 2002/0112247 A1 | 8/2002 | Horner et al. |
| 2002/0122137 A1 | 9/2002 | Chen et al. |
| 2002/0131497 A1 | 9/2002 | Jang |
| 2002/0138843 A1 | 9/2002 | Samaan et al. |
| 2002/0143973 A1 | 10/2002 | Price |
| 2002/0147634 A1 | 10/2002 | Jacoby et al. |
| 2002/0147687 A1 | 10/2002 | Breiter et al. |
| 2002/0167458 A1 | 11/2002 | Baudisch et al. |
| 2002/0188818 A1 | 12/2002 | Nimura et al. |
| 2002/0191575 A1 | 12/2002 | Kalavade et al. |

| | | |
|---|---|---|
| 2003/0001880 A1 | 1/2003 | Holtz et al. |
| 2003/0028873 A1 | 2/2003 | Lemmons |
| 2003/0065915 A1 | 4/2003 | Yu et al. |
| 2003/0093260 A1 | 5/2003 | Dagtas et al. |
| 2003/0095791 A1 | 5/2003 | Barton et al. |
| 2003/0115167 A1 | 6/2003 | Sharif et al. |
| 2003/0159143 A1 | 8/2003 | Chan |
| 2003/0187657 A1 | 10/2003 | Erhart et al. |
| 2003/0192054 A1 | 10/2003 | Birks et al. |
| 2003/0208612 A1 | 11/2003 | Harris et al. |
| 2003/0231621 A1 | 12/2003 | Gubbi et al. |
| 2004/0003406 A1 | 1/2004 | Billmaier |
| 2004/0052216 A1 | 3/2004 | Roh |
| 2004/0068334 A1 | 4/2004 | Tsai et al. |
| 2004/0083301 A1 | 4/2004 | Murase et al. |
| 2004/0100486 A1 | 5/2004 | Flamini et al. |
| 2004/0103340 A1 | 5/2004 | Sundareson et al. |
| 2004/0139047 A1 | 7/2004 | Rechsteiner et al. |
| 2004/0162845 A1 | 8/2004 | Kim et al. |
| 2004/0162903 A1 | 8/2004 | Oh |
| 2004/0172410 A1 | 9/2004 | Shimojima et al. |
| 2004/0205830 A1 | 10/2004 | Kaneko |
| 2004/0212640 A1 | 10/2004 | Mann et al. |
| 2004/0216173 A1 | 10/2004 | Horoszowski et al. |
| 2004/0236844 A1 | 11/2004 | Kocherlakota |
| 2004/0255249 A1 | 12/2004 | Chang et al. |
| 2005/0021398 A1 | 1/2005 | McCleskey et al. |
| 2005/0027821 A1 | 2/2005 | Alexander et al. |
| 2005/0038981 A1 | 2/2005 | Connor et al. |
| 2005/0044058 A1 | 2/2005 | Matthews et al. |
| 2005/0050462 A1 | 3/2005 | Whittle et al. |
| 2005/0053356 A1 | 3/2005 | Mate et al. |
| 2005/0055595 A1 | 3/2005 | Frazer et al. |
| 2005/0060759 A1 | 3/2005 | Rowe et al. |
| 2005/0097542 A1 | 5/2005 | Lee |
| 2005/0114852 A1 | 5/2005 | Chen et al. |
| 2005/0132351 A1 | 6/2005 | Randall et al. |
| 2005/0138560 A1 | 6/2005 | Lee et al. |
| 2005/0198584 A1 | 9/2005 | Matthews et al. |
| 2005/0204046 A1 | 9/2005 | Watanabe |
| 2005/0216851 A1 | 9/2005 | Hull et al. |
| 2005/0227621 A1 | 10/2005 | Katoh |
| 2005/0229118 A1 | 10/2005 | Chiu et al. |
| 2005/0246369 A1 | 11/2005 | Oreizy et al. |
| 2005/0251833 A1 | 11/2005 | Schedivy |
| 2005/0283791 A1 | 12/2005 | McCarthy et al. |
| 2005/0288999 A1 | 12/2005 | Lerner et al. |
| 2006/0011371 A1 | 1/2006 | Fahey |
| 2006/0031381 A1 | 2/2006 | Van Luijt et al. |
| 2006/0050970 A1 | 3/2006 | Gunatilake |
| 2006/0051055 A1 | 3/2006 | Ohkawa |
| 2006/0095401 A1 | 5/2006 | Krikorian et al. |
| 2006/0095471 A1 | 5/2006 | Krikorian et al. |
| 2006/0095472 A1 | 5/2006 | Krikorian et al. |
| 2006/0095942 A1 | 5/2006 | Van Beek |
| 2006/0095943 A1 | 5/2006 | Demircin et al. |
| 2006/0107226 A1 | 5/2006 | Matthews et al. |
| 2006/0117371 A1 | 6/2006 | Margulis |
| 2006/0146174 A1 | 7/2006 | Hagino |
| 2006/0280157 A1 | 12/2006 | Karaoguz et al. |
| 2007/0003224 A1 | 1/2007 | Krikorian et al. |
| 2007/0005783 A1 | 1/2007 | Saint-Hillaire et al. |
| 2007/0022328 A1 | 1/2007 | Tarra et al. |
| 2007/0074115 A1 | 3/2007 | Patten et al. |
| 2007/0076604 A1 | 4/2007 | Litwack |
| 2007/0168543 A1 | 7/2007 | Krikorian et al. |
| 2007/0180485 A1 | 8/2007 | Dua |
| 2007/0198532 A1 | 8/2007 | Krikorian et al. |
| 2007/0234213 A1 | 10/2007 | Krikorian et al. |
| 2007/0286596 A1 | 12/2007 | Lonn |
| 2008/0019276 A1 | 1/2008 | Takatsuji et al. |
| 2008/0037573 A1 | 2/2008 | Cohen |
| 2008/0059533 A1 | 3/2008 | Krikorian |
| 2008/0134267 A1 | 6/2008 | Moghe et al. |
| 2008/0195744 A1 | 8/2008 | Bowra et al. |
| 2008/0199150 A1 | 8/2008 | Candelore |
| 2008/0294759 A1 | 11/2008 | Biswas et al. |
| 2008/0307456 A1 | 12/2008 | Beetcher et al. |
| 2008/0307462 A1 | 12/2008 | Beetcher et al. |
| 2008/0307463 A1 | 12/2008 | Beetcher et al. |
| 2009/0074380 A1 | 3/2009 | Boston et al. |
| 2009/0199248 A1 | 8/2009 | Ngo et al. |
| 2010/0100915 A1 | 4/2010 | Krikorian et al. |

FOREIGN PATENT DOCUMENTS

| | | |
|---|---|---|
| DE | 4407319 A1 | 9/1994 |
| EP | 0838945 A | 4/1998 |
| EP | 1077407 A1 | 2/2001 |
| EP | 1443766 A2 | 8/2004 |
| EP | 1691550 A | 8/2006 |
| EP | 1830558 A1 | 9/2007 |
| GB | 2307151 A | 5/1997 |
| JP | 05244663 A * | 9/1993 |
| JP | 2003304590 A * | 10/2003 |
| KR | 19990082855 A | 11/1999 |
| KR | 20010211410 A | 8/2001 |
| WO | 0133839 A1 | 5/2001 |
| WO | 0147248 A2 | 6/2001 |
| WO | 0193161 A1 | 12/2001 |
| WO | 2003026232 A1 | 3/2003 |
| WO | 03052552 A2 | 6/2003 |
| WO | 03098897 A | 11/2003 |
| WO | 2004032511 A1 | 4/2004 |
| WO | 2005050898 A2 | 6/2005 |
| WO | 2006064454 A1 | 6/2006 |
| WO | 2006074110 A | 7/2006 |
| WO | 2007027891 A2 | 3/2007 |
| WO | 2007051156 A2 | 5/2007 |
| WO | 2007141555 A2 | 12/2007 |
| WO | 2007149466 A2 | 12/2007 |
| WO | 2008024723 A | 2/2008 |

OTHER PUBLICATIONS

China State Intellectual Property Office "First Office Action," issued Jul. 31, 2009, for Application No. 200580026825.X.
USPTO, Non-Final Office Action, mailed Aug. 4, 2009; U.S. Appl. No. 11/734,277, filed Apr. 12, 2007.
USPTO, Final Office Action, mailed Jul. 31, 2009; U.S. Appl. No. 11/683,862, filed Mar. 8, 2007.
USPTO, Non-Final Office Action, mailed Aug. 5, 2009; U.S. Appl. No. 11/147,663, filed Jun. 7, 2005.
USPTO, Non-Final Office Action, mailed Sep. 3, 2009; U.S. Appl. No. 11/620,711, filed Jan. 7, 2007.
Einaudi, Andrew E. et al. "Systems and Methods for Selecting Media Content Obtained from Multiple Sources," U.S. Appl. No. 12/543,278, filed Aug. 18, 2009.
Conway, Frank et al. "Systems and Methods for Creating Variable Length Clips from a Media Stream," U.S. Appl. No. 12/347,465, filed Dec. 31, 2008.
Akella, Aparna Sarma "Systems and Methods for Event Programming Via a Remote Media Player," U.S. Appl. No. 12/537,057, filed Aug. 6, 2009.
Shah, Bhupendra Natwerlan et al. "Systems and Methods for Transcoding and Place Shifting Media Content," U.S. Appl. No. 12/548,130, filed Aug. 26, 2009.
Banger, Shashidhar et al. "Systems and Methods for Automatically Controlling the Resolution of Streaming Video Content," U.S. Appl. No. 12/537,785, filed Aug. 7, 2009.
Panigrahi, Biswaranjan "Home Media Aggregator System and Method," U.S. Appl. No. 12/538,681, filed Aug. 10, 2009.
Nandury, Venkata Kishore "Adaptive Gain Control for Digital Audio Samples in a Media Stream," U.S. Appl. No. 12/507,971, filed Jul. 23, 2009.
Shirali, Amey "Systems and Methods for Providing Programming Content," U.S. Appl. No. 12/538,676, filed Aug. 10, 2009.
Thiyagarajan, Venkatesan "Systems and Methods for Virtual Remote Control of Streamed Media," U.S. Appl. No. 12/538,664, filed Aug. 10, 2009.
Thiyagarajan, Venkatesan et al. "Localization Systems and Method," U.S. Appl. No. 12/538,783, filed Aug. 10, 2009.
Shirali, Amey et al. "Methods and Apparatus for Seeking Within a Media Stream Using Scene Detection," U.S. Appl. No. 12/538,784, filed Aug. 10, 2009.

Thiyagarajan, Venkatesan "Systems and Methods for Updating Firmware Over a Network," U.S. Appl. No. 12/538,661, filed Aug. 10, 2009.
Iyer, Satish "Methods and Apparatus for Fast Seeking Within a Media Stream Buffer," U.S. Appl. No. 12/538,659, filed Aug. 10, 2009.
European Patent Office, International Searching Authority, "International Search Report," for International Application No. PCT/US2009/049006, mailed Sep. 11, 2009.
Lucas, Brian et al. "Systems and Methods for Establishing Connections Between Devices Communicating Over a Network," U.S. Appl. No. 12/426,103, filed Apr. 17, 2009.
European Patent Office, International Searching Authority, "International Search Report," mailed Mar. 30, 2010; International Application PCT/US2009/068468 filed Dec. 27, 2009.
USPTO Non-Final Office Action mailed Mar. 19, 2010; U.S. Appl. No. 11/147,664, filed Jun. 7, 2005.
USPTO Non-Final Office Action mailed Mar. 31, 2010; U.S. Appl. No. 11/620,707, filed Jan. 7, 2007.
USPTO Non-Final Office Action mailed Apr. 1, 2010; U.S. Appl. No. 12/237,103, filed Sep. 24, 2008.
Qiong, Liu et al. "Digital Rights Management for Content Distribution," Proceedings of the Australasian Information Security Workshop Conference on ACSW Frontiers 2003, vol. 21, 2003, XP002571073, Adelaide, Australia, ISSN: 1445-1336, ISBN: 1-920682-00-7, sections 2 and 2.1.1.
International Search Report and Written Opinion for International Application No. PCT/US2006/025911, mailed Jan. 3, 2007.
International Search Report for International Application No. PCT/US2007/063599, mailed Dec. 12, 2007.
International Search Report for International Application No. PCT/US2007/076337, mailed Oct. 20, 2008.
International Search Report and Written Opinion for International Application No. PCT/US2006/025912, mailed Jul. 17, 2008.
International Search Report for International Application No. PCT/US2008/059613, mailed Jul. 21, 2008.
International Search Report and Written Opinion for International Application No. PCT/US2008/080910, mailed Feb. 16, 2009.
Wikipedia "Slingbox" [Online], Oct. 21, 2007, XP002512399; retrieved from the Internet: <URL:http://en.wikipedia.org/w/index.php?title=Slingbox&oldid=166080570>; retrieved on Jan. 28, 2009.
Wikipedia "LocationFree Player" [Online], Sep. 22, 2007, XP002512400; retrieved from the Internet: <URL:http://en.wikipedia.org/w/index.php?title=LocationFree_Player&oldid=159683564>; retrieved on Jan. 28, 2009.
Capable Networks LLC "Keyspan Remote Control—Controlling Your Computer With a Remote" [Online], Feb. 21, 2006, XP002512495; retrieved from the Internet: <URL:http://www.slingcommunity.com/article/11791/Keyspan-Remote-Control---Controlling-Your-Computer-With-a-Remote/?highlight=remote+control>; retrieved on Jan. 28, 2009.
Sling Media Inc. "Slingbox User Guide" [Online] 2006, XP002512553; retrieved from the Internet: <URL:http://www.slingmedia.hk/attach/en-US_Slingbox_User_Guide_v1.2.pdf>; retrieved on Jan. 29, 2009.
Sony Corporation "LocationFree TV" [Online], 2004, SP002512410; retrieved from the Internet: <URL:http://www.docs.sony.com/release/LFX1_X5revision.pdf>; retrieved on Jan. 28, 2009 [note—document uploaded in two parts as file exceeds the 25MB size limit].
Sony Corporation "LocationFree Player Pak—LocationFree Base Station—LocationFree Player" [Online] 2005, XP002512401; retrieved from the Internet: <URL:http://www.docs.sony.com/release/LFPK1.pdf>; retrieved on Jan. 28, 2009.
Krikorian, Jason, U.S. Appl. No. 11/734,277, filed Apr. 12, 2007.
Tarra, Raghuveer et al., U.S. Appl. No. 60/975,239, filed Sep. 26, 2007.
Williams, George Edward, U.S. Appl. No. 12/167,041, filed Jul. 2, 2008.
Rao, Padmanabha R., U.S. Appl. No. 12/166,039, filed Jul. 1, 2008.
International Search Report and Written Opinion, PCT/US2005/020105, Feb. 15, 2007, 6 pages.
International Search Report and Written Opinion for PCT/US2006/04382, mailed Apr. 27, 2007.
Archive of "TV Brick Home Server," www.tvbrick.com, [online] [Archived by http://archive.org on Jun. 3, 2004; Retrieved on Apr. 12, 2006] retrieved from the Internet <URL:http://web.archive.org/web/20041107111024/www.tvbrick.com/en/affiliate/tvbs/tvbrick/document18/print>.
Faucon, B. "TV 'Brick' Opens up Copyright Can of Worms,"Financial Review, Jul. 1, 2003, [online [Retrieved on Apr. 12, 2006] Retrieved from the Internet, URL:http://afr.com/cgi-bin/newtextversions.pl?storyid+1056825330084&3ate+2003/07/01&pagetype+printer§ion+1053801318705&path+articles/2003/06/30/0156825330084.html.].
Balster, Eric J., "Video Compression and Rate Control Methods Based on the Wavelet Transform," The Ohio State University 2004, pp. 1-24.
Kulapala et al., "Comparison of Traffic and Quality Characteristics of Rate-Controlled Wavelet and DCT Video," Arizona State University, Oct. 11, 2004.
Skodras et al., "JPEG2000: The Upcoming Still Image Compression Standard," May 11, 2000, 14 pages.
Taubman et al., "Embedded Block Coding in JPEG2000," Feb. 23, 2001, pp. 1-8 of 36.
Kessler, Gary C., An Overview of TCP/IP Protocols and the Internet; Jan. 16, 2007, retrieved from the Internet on Jun. 12, 2008 at http://www.garykessler.net/library/tcpip.html; originally submitted to the InterNIC and posted on their Gopher site on Aug. 5, 1994.
Roe, Kevin, "Third-Party Observation Under EPC Article 115 on the Patentability of an Invention," Dec. 21, 2007.
Roe, Kevin, Third-Party Submission for Published Application Under CFR §1.99, Mar. 26, 2008.
Bajpai, Parimal et al. "Systems and Methods of Controlling the Encoding of a Media Stream," U.S. Appl. No. 12/339,878, filed Dec. 19, 2008.
Malone, Edward D. et al. "Systems and Methods for Controlling Media Devices," U.S. Appl. No. 12/256,344, filed Oct. 22, 2008.
Banger, Shashidhar et al. "Systems and Methods for Determining Attributes of Media Items Accessed Via a Personal Media Broadcaster," U.S. Appl. No. 12/334,959, filed Dec. 15, 2008.
Kulkarni, Anant Madhava "Systems and Methods for Creating Logical Media Streams for Media Storage and Playback," U.S. Appl. No. 12/323,907, filed Nov. 26, 2008.
Rao, Padmanabha R. "Systems and Methods for Linking Media Content," U.S. Appl. No. 12/359,784, filed Jan. 26, 2009.
Krikorian, Blake Gary et al. "Systems and Methods for Presenting Media Content Obtained From Multiple Sources," U.S. Appl. No. 12/408,456, filed Mar. 20, 2009.
Krikorian, Blake Gary et al. "Systems and Methods for Projecting Images From a Computer System," U.S. Appl. No. 12/408,460, filed Mar. 20, 2009.
European Patent Office, European Search Report for European Application No. EP 08 16 7880, mailed Mar. 4, 2009.
Mythtv Wiki, "MythTV User Manual" [Online], Aug. 27, 2007, XP002515046; retrieved from the Internet: <URL: http://www.mythtv.org/wiki?title=User_Manual:Introduction&oldid=25549>.
International Searching Authority, Written Opinion and International Search Report for International Application No. PCT/US2008/077733, mailed Mar. 18, 2009.
International Searching Authority, Written Opinion and International Search Report for International Application No. PCT/US2008/087005, mailed Mar. 20, 2009.
Watanabe Y. et al., "Multimedia Database System for TV Newscasts and Newspapers"; Lecture Notes in Computer Science, Springer Verlag, Berlin, Germany; vol. 1554, Nov. 1, 1998, pp. 208-220, XP002402824, ISSN: 0302-9743.
Yasuhiko Watanabe et al., "Aligning Articles in TV Newscasts and Newspapers"; Proceedings of the International Conference on Computationallinguistics, XX, XX, Jan. 1, 1998, pp. 1381-1387, XP002402825.
Sodergard C. et al., "Integrated Multimedia Publishing: Combining TV and Newspaper Content on Personal Channels"; Computer Networks, Elsevier Science Publishers B.V., Amsterdam, Netherlands; vol. 31, No. 11-16, May 17, 1999, pp. 1111-1128, XP004304543, ISSN: 1389-1286.

Ariki Y. et al., "Automatic Classification of TV News Articles Based on Telop Character Recognition"; Multimedia Computing and Systems, 1999; IEEE International Conference on Florence, Italy, Jun. 7-11, 1999, Los Alamitos, California, USA, IEEE Comput. Soc. US; vol. 2, Jun. 7, 1999, pp. 148-152, XP010519373, ISBN: 978-0-7695-0253-3; abstract, paragraph [03.1], paragraph [05.2], figures 1,2.

USPTO, Non-Final Office Action mailed Dec. 17, 2004; U.S. Appl. No. 09/809,868, filed Mar. 15, 2001.

USPTO, Final Office Action mailed Jul. 28, 2005; U.S. Appl. No. 09/809,868, filed Mar. 15, 2001.

USPTO, Non-Final Office Action mailed Jan. 30, 2006; U.S. Appl. No. 09/809,868, filed Mar. 15, 2001.

USPTO, Final Office Action mailed Aug. 10, 2006; U.S. Appl. No. 09/809,868, filed Mar. 15, 2001.

USPTO, Non-Final Office Action mailed Jun. 19, 2007; U.S. Appl. No. 09/809,868, filed Mar. 15, 2001.

USPTO, Non-Final Office Action mailed Apr. 16, 2008; U.S. Appl. No. 09/809,868, filed Mar. 15, 2001.

USPTO, Final Office Action mailed Sep. 18, 2008; U.S. Appl. No. 09/809,868, filed Mar. 15, 2001.

USPTO, Non-Final Office Action mailed Mar. 31, 2009; U.S. Appl. No. 09/809,868, filed Mar. 15, 2001.

USPTO, Non-Final Office Action mailed May 1, 2008; U.S. Appl. No. 11/111,265, filed Apr. 21, 2005.

USPTO, Final Office Action mailed Dec. 29, 2008; U.S. Appl. No. 11/111,265, filed Apr. 21, 2005.

USPTO, Non-Final Office Action mailed Jun. 8, 2009; U.S. Appl. No. 11/111,265, filed Apr. 21, 2005.

USPTO, Non-Final Office Action mailed Jun. 26, 2008; U.S. Appl. No. 11/620,707, filed Jan. 7, 2007.

USPTO, Final Office Action mailed Oct. 21, 2008; U.S. Appl. No. 11/620,707, filed Jan. 7, 2007.

USPTO, Non-Final Office Action mailed Mar. 25, 2009; U.S. Appl. No. 11/620,707, filed Jan. 7, 2007.

USPTO, Non-Final Office Action mailed Aug. 7, 2008; U.S. Appl. No. 11/620,711, filed Jan. 7, 2007.

USPTO, Final Office Action mailed Feb. 9, 2009; U.S. Appl. No. 11/620,711, filed Jan. 7, 2007.

USPTO, Non-Final Office Action mailed Feb. 25, 2009; U.S. Appl. No. 11/683,862, filed Mar. 8, 2007.

USPTO, Non-Final Office Action mailed Dec. 24, 2008; U.S. Appl. No. 11/147,985, filed Jun. 7, 2005.

USPTO, Non-Final Office Action mailed Jun. 25, 2008; U.S. Appl. No. 11/428,254, filed Jun. 30, 2006.

USPTO, Final Office Action mailed Feb. 6, 2009; U.S. Appl. No. 11/428,254, filed Jun. 30, 2006.

USPTO, Non-Final Office Action mailed May 15, 2009; U.S. Appl. No. 11/147,664, filed Jun. 7, 2005.

Sonic Blue "ReplayTV 5000 User's Guide," 2002, entire document.

Bluetooth-News; Main Future User Models Document Verification & Qualification: Bluetooth Technical Background, Apr. 21, 1999; pp. 1 of 7 and 2 of 7; http://www.bluetooth.com/v2/news/show.asp 1-2.

Microsoft Corporation; Harman/Kardon "Master Your Universe" 1999.

Matsushita Electric Corporation of America MicroCast: Wireless PC Multimedia Transceiver System, Nov. 1998.

"Wireless Local Area Networks: Issues in Technology and Standards" Jan. 6, 1999.

USPTO, Final Office Action mailed Jun. 25, 2009; U.S. Appl. No. 11/147,985, filed Jun. 7, 2005.

Lee, M. et al. "Video Frame Rate Control for Non-Guaranteed Network Services with Explicit Rate Feedback," Globecom'00, 2000 IEEE Global Telecommunications conference, San Francisco, CA, Nov. 27-Dec. 1, 2000; [IEEE Global Telecommunications Conference], New York, NY; IEEE, US, vol. 1,Nov. 27, 2000, pp. 293-297, XP001195580; ISBN: 978-0-7803-6452-3, lines 15-20 of sec. II on p. 293, fig. 1.

European Patent Office, International Searching Authority, "International Search Report and Written Opinion," mailed Jun. 4, 2010 for International Application No. PCT/IN2009/000728, filed Dec. 18, 2009.

USPTO Non-Final Office Action mailed Jun. 23, 2010; U.S. Appl. No. 11/933,969, filed Nov. 1, 2007.

Korean Intellectual Property Office "Official Notice of Preliminary Rejection," issued Jun. 18, 2010; Korean Patent Application No. 10-2008-7021254.

China State Intellectual Property Office "Office Action" issued Mar. 18, 2010 for Application No. 200680022520.6.

China State Intellectual Property Office "Office Action" issued Apr. 13, 2010 for Application No. 200580026825.X.

Canadian Intellectual Property Office "Office Action" mailed Feb. 18, 2010 for Application No. 2569610.

European Patent Office "European Search Report," mailed May 7, 2010 for Application No. 06786174.0.

Margulis, Neal "Apparatus and Method for Effectively Implementing a Wireless Television System," U.S. Appl. No. 12/758,193, filed Apr. 12, 2010.

Margulis, Neal "Apparatus and Method for Effectively Implementing a Wireless Television System," U.S. Appl. No. 12/758,194, filed Apr. 12, 2010.

Margulis, Neal "Apparatus and Method for Effectively Implementing a Wireless Television System," U.S. Appl. No. 12/758,196, filed Apr. 12, 2010.

Kirkorian, Jason Gary et al. "Personal Media Broadcasting System with Output Buffer," U.S. Appl. No. 12/757,697, filed Apr. 9, 2010.

Tarra, Raghuveer et al. "Firmware Update for Consumer Electronic Device," U.S. Appl. No. 12/757,714, filed Apr. 9, 2010.

China State Intellectual Property Office "First Office Action," issued Jan. 8, 2010, for Application No. 200810126554.0.

USPTO Final Office action mailed Jan. 25, 2010; U.S. Appl. No. 11/734,277, filed Apr. 12, 2007.

Australian Government "Office Action," Australian Patent Application No. 2006240518, mailed Nov. 12, 2009.

Jain, Vikal Kumar "Systems and Methods for Coordinating Data Communication Between Two Device," U.S. Appl. No. 12/699,280, filed Feb. 3, 2010.

Gangotri, Arun L. et al. "Systems and Methods and Program Applications for Selectively Restructuring the Placeshiftnig of Copy Protected Digital Media Content," U.S. Appl. No. 12/623,955, filed Nov. 23, 2009.

Paul, John et al. "Systems and Methods for Searching Media Content," U.S. Appl. No. 12/648,024, filed Dec. 28, 2009.

Newton's Telcom Dictionary, 20th ed., Mar. 2004.

"The Authoritative Dictionary of IEEE Standard Terms," 7th ed. 2000.

Gurzhi, Alexander et al. "Systems and Methods for Emulation Network-Enabled Media Components," U.S. Appl. No. 12/711,830, filed Feb. 24, 2010.

USPTO Final Office Action mailed Mar. 3, 2010; U.S. Appl. No. 11/111,265, filed Apr. 21, 2005.

USPTO, Final Office Action mailed Mar. 12, 2010; U.S. Appl. No. 11/620,711, filed Jan. 7, 2007.

USPTO, Final Office Action, mailed Nov. 6, 2009; U.S. Appl. No. 09/809,868, filed Mar. 15, 2001.

USPTO, Final Office Action mailed Nov. 12, 2009; U.S. Appl. No. 11/620,707, filed Jan. 7, 2007.

USPTO, Non-Final Office Action mailed Nov. 23, 2009; U.S. Appl. No. 11/683,862, filed Mar. 8, 2007.

USPTO, Non-Final Office Action mailed Oct. 1, 2009; U.S. Appl. No. 11/778,287, filed Jul. 16, 2007.

USPTO Final Office Action mailed Dec. 30, 2009; U.S. Appl. No. 11/147,664, filed Jun. 7, 2005.

European Patent Office, European Search Report, mailed Sep. 28, 2009 for European Application No. EP 06 78 6175.

International Search Report for PCT/US2008/069914 mailed Dec. 19, 2008.

PCT Partial International Search, PCT/US2009/054893, mailed Dec. 23, 2009.

Newton's Telecom Dictionary, 21st ed., Mar. 2005.

Ditze M. et all "Resource Adaptation for Audio-Visual Devices in the UPnP QoS Architecture," Advanced Networking and Applications, 2006; AINA, 2006; 20% H International conference on Vienna, Austria Apr. 18-20, 2006.

Joonbok, Lee et al. "Compressed High Definition Television (HDTV) Over IPv6," Applications and the Internet Workshops, 2006; Saint Workshops, 2006; International Symposium, Phoenix, AZ, USA, Jan. 23-27, 2006.

Lowekamp, B. et al. "A Hierarchy of Network Performance Characteristics for Grid Applications and Services," GGF Network Measurements Working Group, pp. 1-29, May 24, 2004.

Meyer, Derrick "MyReplayTV™ Creates First-Ever Online Portal to Personal TI! Service; Gives Viewers Whole New Way to Interact With Programming," http://web.archive.org/web/20000815052751/http://www.myreplaytv.com/, Aug. 15, 2000.

Sling Media "Sling Media Unveils Top-of-Line Slingbox PRO-HD" [online], Jan. 4, 2008, XP002560049; retrieved from the Internet: URL:www.slingmedia.com/get/pr-slingbox-pro-hd.html; retrieved on Oct. 12, 2009.

Srisuresh, P. et al. "Traditional IP Network Address Translator (Traditional NAT)," Network Working Group, The Internet Society, Jan. 2001.

Asnis, Ilya et al. "Mediated Network address Translation Traversal" U.S. Appl. No. 12/405,039, filed Mar. 16, 2009.

Thiyagarajan, Venkatesan et al. "Always-On-Top Media Player Launched From a Web Browser," U.S. Appl. No. 12/617,271, filed Nov. 12, 2009.

Paul, John Michael et al. "Systems and Methods for Delivering Messages Over a Network," U.S. Appl. No. 12/619,192, filed Nov. 16, 2009.

Rao, Padmanabha R. et al. "Methods and Apparatus for Establishing Network Connections Using an Inter-Mediating Device," U.S. Appl. No. 12/642,368, filed Dec. 18, 2009.

Dham, Vikram et al. "Systems and Methods for Establishing Network Connections Using Local Mediation Services," U.S. Appl. No. 12/644,918, filed Dec. 22, 2009.

Paul, John et al. "Systems and Methods for Remotely Controlling Media Server Via a Network," U.S. Appl. No. 12/645,870, filed Dec. 23, 2009.

Bajpal, Parimal et al. "Method and Node for Transmitting Data Over a Communication Network using Negative Ackhowledgement," U.S. Appl. No. 12/404,920, filed Mar. 16, 2009.

Bajpal, Parimal et al. "Method and Note for Employing Network connections Over a Connectinoless Transport Layer Protocol," U.S. Appl. No. 12/405,062, filed Mar. 16, 2009.

* cited by examiner

REMOTE CONTROL AND METHOD FOR AUTOMATICALLY ADJUSTING THE VOLUME OUTPUT OF AN AUDIO DEVICE

TECHNICAL FIELD

The present disclosure relates generally to embodiments of a method and a remote control for automatically adjusting the volume of a television or other audio device.

BACKGROUND

There are many scenarios under which a user may be required to adjust the volume output of a television to ensure that the sound level at the user's location is loud enough to be audible to the user, while not being excessively loud so as to provide an unpleasant listening experience. For example, the average and maximum volume levels may vary significantly from television channel to television channel, as set by the cable distributor. The average and maximum volume levels of a particular television channel can also fluctuate significantly with changes in programming; e.g., the volume output of a television may increase above a comfortable listening level during commercial programming that has an increased average volume relative to the primary programming. As a further example, the user's location relative to the sound's origin may vary; e.g., the distance between the user and the television may vary as the user changes seating position or otherwise moves within a room. As a still further example, the level of ambient noise produced by sources other than the television may vary significantly depending upon, for example, the time of day.

In each of the above scenarios, a user is typically required to adjust the volume output of the television to maintain the volume within a desired range and to compensate for changes in listening conditions. Thus, while the burden is significantly lessened through the use of a remote control, a burden is still placed on the user to continually adjust the volume output of the television to maintain the volume within a desired listening range. Although certain freestanding devices have been developed to further ease this burden by preventing the volume output of a television from increasing above a predetermined maximum decibel level (e.g., 30 decibels), such devices are relatively costly, occupy additional space, and require additional interconnections between freestanding components.

There thus exists an ongoing need to provide embodiments of a remote control and a method for automatically adjusting the volume output of a television (or other audio device) to compensate for variations in listening conditions. Preferably, embodiments of such a remote control would maintain the television volume, as detected by the remote control, within a desired range. Ideally, embodiments of such a remote control would be relatively inexpensive to implement, would utilize a minimal number of components (e.g., a single microphone), and would function independently of other electronic devices. These and other desirable features and characteristics will become apparent from the subsequent Detailed Description and the appended Claims, taken in conjunction with the accompanying Drawings and the foregoing Background.

BRIEF SUMMARY

Embodiments of a remote control are provided for automatically adjusting the volume output of an audio device, such as a television. In one embodiment, the remote control includes a wireless transmitter configured to transmit command signals to the audio device, a microphone configured to monitor sound levels external to the remote control, a memory storing a first threshold, and a controller. The controller is configured to: (i) determine a signal-to-noise ratio as a function of the sound levels detected by the microphone, and (ii) transmit via the wireless transmitter a first command to adjust the volume output of the audio device if the signal-to-noise ratio passes the first threshold.

Embodiments of a method are further provided for automatically adjusting the volume output of an audio device. The method is executable by a controller in a remote control. In one embodiment, the method includes the steps of storing a first threshold in a memory, monitoring sound levels external to the remote control utilizing a single microphone, determining in the controller a signal-to-noise ratio as a function of the sound levels detected by the microphone, and transmitting via a wireless transmitter a first command to adjust the volume output of the audio device if the signal-to-noise ratio passes than the first threshold.

Various other embodiments, aspects and other features are described in more detail below.

BRIEF DESCRIPTION OF THE DRAWING FIGURES

Exemplary embodiments will hereinafter be described in conjunction with the following Drawing Figures, wherein like numerals denote like elements, and:

DETAILED DESCRIPTION

The following Detailed Description is merely exemplary in nature and is not intended to limit the invention or the application and uses of the invention. Furthermore, there is no intention to be bound by any theory presented in the preceding Background or the following Detailed Description. As appearing herein, the phrase "volume output of an audio device" and similar phrases are utilized to generally describe the loudness of sound produced in accordance with audio signals generated by an audio device and perceived at the sound's origin, which will typically be one or more loudspeakers included within the audio device or otherwise connected to the audio device. Similarly, the phrase "perceived volume of the audio device" and similar phrases are utilized to denote the perceived loudness of sound at a hypothetical user's or listener's location. It will be understood that the term "volume" is a subjective description of perceived loudness conventionally utilized in the field of consumer electronics and is distinct from, although related to, objective measurements of sound pressure, such as decibel level and sound intensity.

Figure 1:
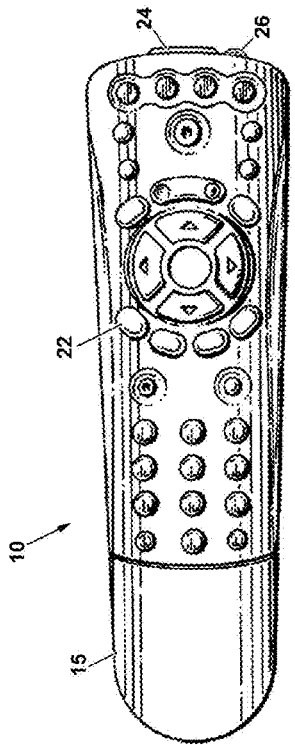
FIG. 1 is an isometric view of a remote control suitable for controlling the volume output of an audio device, such as a television, in accordance with an exemplary embodiment.
Figure 2:
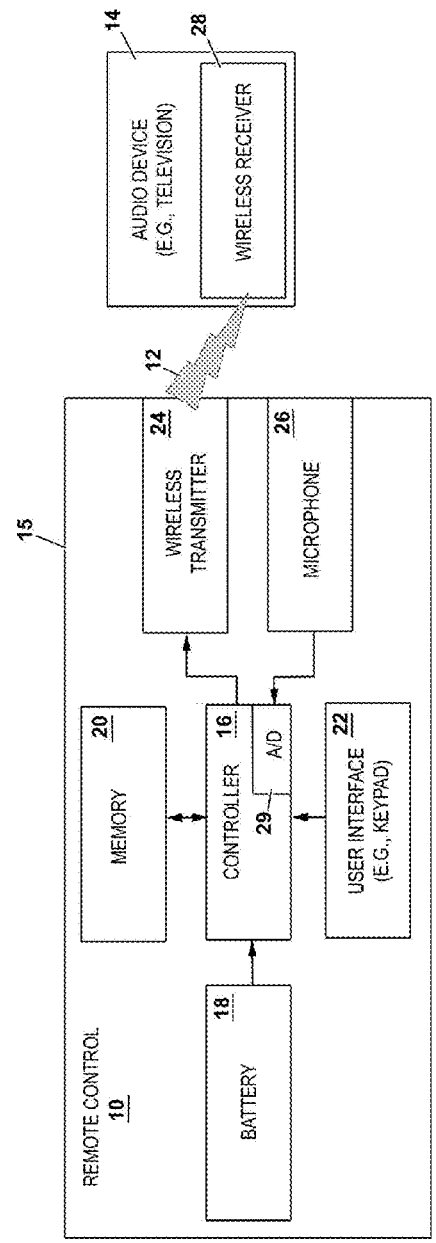
FIG. 2 is a block diagram illustrating a number of components that may be included within the exemplary remote control shown in FIG. 1.

FIG. 1 is an isometric view of a remote control 10 in accordance with an exemplary embodiment, and FIG. 2 is a block diagram illustrating a number of components that may be included within exemplary remote control 10. As indicated in FIG. 2 at 12, remote control 10 is configured to send wireless command signals to an audio device 14. Audio device 14 is any electrical device that generates an audio output signal, which may then be applied to one or more loudspeakers to generate sound. As indicated in FIG. 2, audio device 14 preferably assumes the form of a television set. However, audio device 14 may also assume various other forms including, but not limited to, that of a set-top box, a dedicated media playback device (e.g., a digital versatile disc player), a radio receiver, a stereo system, and the like. The loudspeakers to which the audio output signals of audio device 14 are applied may be integrated into audio device 14 or may be independent of audio device 14 and connected thereto utilizing a coaxial cable, speaker wire, or other conventional connector cable.

In the exemplary embodiment illustrated in FIGS. 1 and 2, remote control 10 includes a housing 15 (FIGS. 1 and 2) containing a controller 16 (FIG. 2), a battery 18 (FIG. 2), a memory 20 (FIG. 2), a user interface 22 (FIGS. 1 and 2), a wireless transmitter 24 (FIGS. 1 and 2), and a single microphone 26 (FIGS. 1 and 2). First, second, third, and fourth inputs of controller 16 are operatively coupled to battery 18, to memory 20, to user interface 22, and to microphone 26, respectively; and first and second outputs of controller 16 are operatively coupled to memory 20 and to wireless transmitter 24, respectively. Controller 16 may include any suitable number of individual microprocessors, microcontrollers, digital signal processors, programmed arrays, and other standard components known in the art. In addition, controller 16 may perform or cooperate with any number of programs or instructions designed to carry out embodiments of the automatic volume adjustment process described below in conjunction with FIG. 3. In a similar regard, memory 20 may include any number of digital storage elements capable storing digital information required to execute embodiments of the automatic volume adjustment process. Although illustrated as an independent component in FIG. 2, memory 20 may be included within controller 16 in certain embodiments.

User interface 22 may comprise any input device or devices suitable for receiving user input data of the type described below. As indicated in FIGS. 1 and 2, user interface 22 preferably assumes the form of a keypad having an array of buttons dedicated to various command functions traditionally performed by a wireless remote control. This notwithstanding, user interface 22 may include various other types of user input devices in addition to, or in lieu of a keypad, including various dials, slides, switches, and the like. User interface 22 conveniently includes independent volume up and volume down inputs, which may comprise dedicated volume up and volume down buttons, respectively, when user interface 22 assumes the form of a keypad. During operation of remote control 10, controller 16 monitors the volume up input and the volume down input for actuation by a user. When determining that either the volume up input or the volume down input has been actuated (e.g., depressed), controller 16 causes wireless transmitter 24 to transmit a corresponding command signal to audio device 14 and, more specifically, to a compatible wireless receiver 28 included within or otherwise associated with audio device 14. Control circuitry within audio device 14 then increases or decreases the volume output of audio device 14 in accordance with the received command signal. Wireless transmitter 24 is any device suitable for sending wireless command signals to wireless receiver 28 in this regard. In many embodiments, wireless transmitter 24 includes at least one infrared emitter configured to transmit infrared (IR) command signals to wireless receiver 28; however, wireless transmitter 24 may be configured to transmit any suitable type of wireless command signal to wireless receiver 28 including radio frequency (e.g., ultra-high frequency) command signals.

Microphone 26 is any transducer capable of converting sound waves received at remote control 10 to electrical signals that may then be applied to controller 16 and, more specifically, to an analog-to-digital converter operatively coupled to or included within controller 16 as illustrated generically in FIG. 2 at 29. Microphone 26 is preferably omni-directional. Furthermore, and as illustrated in FIG. 1, microphone 26 is preferably mounted through the leading sidewall of housing 15 adjacent wireless transmitter 24. During use of remote control 10, a user typically positions remote control 10 such that wireless transmitter 24 is pointed toward audio device 14; thus, by mounting microphone 26 through the leading sidewall of housing 15 adjacent wireless transmitter 24, microphone 26 will typically be directed toward audio device 14 and can consequently better register sounds produced by the loudspeaker or loudspeakers associated with audio device 14. In addition, when mounted through the leading sidewall of housing 15 in this manner, microphone 26 is less likely to be covered by a user's hand or by another surface during usage.

As described more fully below in conjunction with FIG. 3, controller 16 is configured to implement an automatic volume adjustment process in accordance with data received from microphone 26 to maintain the volume output of audio device 14 within a desired range. Notably, remote control 10 will typically be in the vicinity of the user; thus, the sound level detected by microphone 26 will typically correspond to the sound level at or near the user's location. By repeatedly performing the exemplary process described below, controller 16 may automatically cause wireless transmitter 24 to emit VOLUME UP and VOLUME DOWN command signals, as appropriate, to adjust volume output of audio device 14 based upon variations in listening conditions, such as changes in the loudness of television programming and in ambient noise levels. In addition, by repeatedly performing the exemplary process described below, controller 16 can also dynamically adjust the volume output of audio device 14 in relation to a user's movement; e.g., controller 16 may send commands signals to audio device 14 to increase its volume output as a user moves away from device 14.

Figure 3:
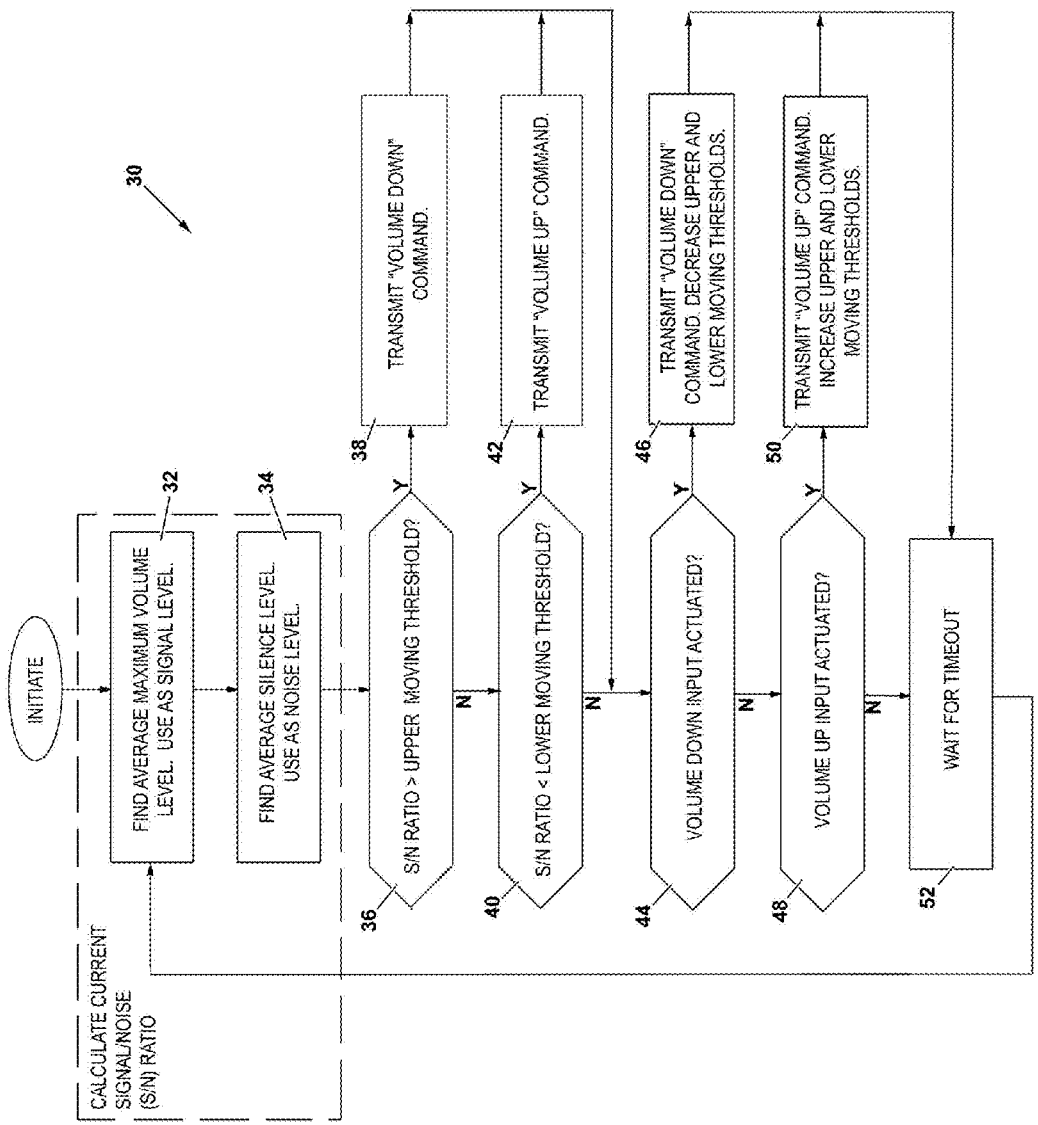
FIG. 3 is a flowchart illustrating an exemplary process that may be performed by the remote control shown in FIGS. 1 and 2 to automatically transmit volume command signals such that the volume output of the audio device is maintained within a desired range.

FIG. 3 is a flowchart illustrating an exemplary process 30 that may be performed by controller 16 (FIG. 2) to maintain the volume of audio device 14 (FIG. 2), as detected by microphone 26 (FIG. 2), within a desired range. Referring collectively to FIGS. 1-3, after initialization of process 30, controller 16 calculates a signal-to-noise ratio utilizing the sound levels detected by microphone 26 over a given time period. The time period can have a predetermined duration (e.g., three seconds) and, therefore, may be held constant for each iteration of process 30. Alternatively, duration of the time period can vary between different iterations of process 30 based upon, for example, the amount of time required to detect a certain number of sound wave peaks exceeding a predetermined threshold stored in memory 20 (FIG. 1). For example, and as indicated in FIG. 3 at STEP 32, controller 16 may first find the average maximum volume level by determining the average value of two more or more successive wave peaks measured during the given time period. Controller 16 may then utilize the average maximum volume level as the device signal level in subsequent calculations described below.

After finding the maximum volume level (STEP 32, FIG. 3), controller 16 next controller 16 finds the average minimum volume level (STEP 34, FIG. 3). The average minimum volume level will generally correspond to brief period of time over which audio device 14 produces little to no sound; for this reason, the average minimum volume level is identified in FIG. 3 and referred to herein as the "silence level." In a preferred embodiment, controller 16 determines the silence level by establishing the average value of two or more successive wave trough measurements detected during the time period. Utilizing the device silence level as the ambient noise level, controller 16 may then calculate the signal-to-noise ratio ("S/N ratio"), which controller 16 can then utilize to determine whether to generate VOLUME UP or VOLUME DOWN command signals as described more fully below.

Continuing with exemplary process 30 illustrated in FIG. 3, controller 16 next determines if the current S/N ratio is greater than an upper moving threshold stored in memory 20 (STEP 36, FIG. 3). If controller 16 determines that the current S/N ratio is greater than the upper moving threshold, controller 16 causes transmitter 24 to transmit a VOLUME DOWN command to decrease the audio output of audio device 14 (STEP 38, FIG. 3). In this manner, controller 16 prevents the volume of level of audio device 14, as detected by microphone 26, from increasing above the upper moving threshold. After transmitting a VOLUME DOWN command (STEP 38, FIG. 3), controller 16 advances to STEP 44 of process 30. However, if during STEP 38 controller 16 instead determines that the current S/N ratio is less than or equal to the upper moving threshold, controller 16 advances to STEP 40 of process 30 (FIG. 3) and determines if the S/N ratio is less than a lower moving threshold stored in memory 20. If, during STEP 40, controller 16 determines that the current S/N ratio is greater than or equal to the lower moving threshold, controller 16 advances directly to STEP 44 as described below. However, if controller 16 instead determines the current S/N ratio is less than the lower moving threshold, controller 16 causes wireless transmitter 24 to emit a VOLUME UP command (STEP 42, FIG. 3) before continuing to STEP 44 of process 30. In so doing, controller 16 effectively prevents the volume level of audio device 14, as detected by microphone 26, from decreasing below the lower moving threshold.

During STEP 44 of process 30, controller 16 determines if the volume down input included within user interface 22 has been actuated by a user; e.g., if the volume down input assumes the form of a dedicated button, controller 16 determines if the volume down button has been depressed. If determining that the volume down input has been actuated, controller 16 advances to STEP 46 of process 30 (FIG. 3) and causes wireless transmitter 24 to transmit a VOLUME DOWN command to audio device 14. In addition, controller 16 decreases the upper moving threshold and the lower moving threshold stored in memory 20; e.g., controller 16 recalls the upper and lower moving thresholds from memory 20, determines the new values for the upper and lower moving thresholds, and then rewrites new values of the upper and lower moving thresholds into memory 20. By automatically decreasing the upper and lower moving thresholds when a user actuates the volume down input, controller 16 enables a user to continually adjust the upper and lower moving thresholds in an intuitive manner to include a volume range preferred by the user under the present listening conditions. After decreasing the upper moving threshold and the lower moving threshold, controller 16 advances to STEP 50 of process 30 (FIG. 3).

If determining that the volume down input has not been actuated during STEP 44, controller 16 next determines whether the volume up input has been actuated (STEP 48, FIG. 3); e.g., as a more specific example, if the volume up input assumes the form of a button, controller 16 determines whether the volume up button has been depressed during STEP 48. If controller 16 determines that the volume up input has been actuated, controller 16 advances to STEP 50 (FIG. 3) and causes wireless transmitter 24 to transmit a VOLUME UP command to increase the volume output of audio device 14. In addition, controller 16 increases the upper moving threshold and the lower moving threshold stored in memory 20 (STEP 50, FIG. 3). Again, by automatically adjusting the upper and lower thresholds in relation to the actuation of the volume up and volume down inputs, controller 16 enables a user to adjust the upper and lower moving thresholds in an intuitive manner to a volume range preferred under the present listening conditions. Controller 16 then advances to STEP 52 and pauses for a predetermined time period (e.g., two or three seconds) before returning to STEP 32 and repeating the above-described automatic volume adjustment process. By pausing for a predetermined time period during STEP 52, controller 16 decreases the overall power requirements of remote control 10 and thus helps to prolong the life of battery 18 (FIG. 2).

The foregoing has thus provided an exemplary embodiment of a remote control and method for automatically adjusting the volume of an audio device, such as a television, to maintain the volume of the audio device within a desired range. More specifically, above-described exemplary remote control automatically transmits VOLUME UP and VOLUME DOWN commands to an audio device in relation to variations in the volume output of the audio device and ambient noise levels, as detected by a single microphone included within the remote control. Furthermore, when carried on a user's person, the above-described remote control automatically transmits command signals to the audio device to increase or decrease the volume of the audio device dynamically in relation to the user's movement relative to the audio device.

As utilized herein, the word "exemplary" means "serving as an example, instance, or illustration." Any implementation described herein as exemplary is not necessarily to be construed as preferred or advantageous over other implementations. While the foregoing Detailed Description will provide those skilled in the art with a convenient road map for implementing various embodiments of the invention, it should be appreciated that the particular embodiments described above are only examples, and are not intended to limit the scope, applicability, or configuration of the invention in any way. To the contrary, various changes may be made in the function and arrangement of elements described without departing from the scope of the invention.

What is claimed is:

1. A remote control configured to automatically adjust the volume output of an audio device, the remote control comprising:
   a wireless transmitter configured to transmit command signals to the audio device;
   a microphone configured to monitor sound levels external to the remote control;
   a memory storing a first threshold and a second threshold different from the first threshold;
   a volume down input; and
   a controller configured to: (i) determine a signal-to-noise ratio as a function of the sound levels detected by the microphone, (ii) transmit via the wireless transmitter a first-command to decrease the volume output of the audio device if the signal-to-noise ratio is greater than the first threshold, (iii) transmit via the wireless transmitter a second command to increase the volume output of the audio device if the signal-to-noise ratio is less than the second threshold, and (iv) to decrease the values of the first and second thresholds, as stored in the memory, when the volume down input is actuated.

2. A remote control according to claim 1 wherein the controller is configured to determine the signal level as a function of average the minimum volume levels detected by the microphone over a given time period.

3. A remote control according to claim 2 wherein the controller is configured to determine the noise level as a function of the average maximum volume levels detected by the microphone over a given time period.

4. A remote control according to claim 1 wherein the controller is configured to further transmit via the wireless transmitter the first command to decrease the volume output of the audio device when the volume down input is actuated.

5. A remote control according to claim 4 wherein the controller is further configured to pause for a predetermined time period after the first command is transmitted.

6. A remote control according to claim 1 further comprising a second user input operatively coupled to the controller, the controller further configured to increase the value of the first threshold and the value of the second threshold stored in the memory when the second user input is actuated.

7. A remote control according to claim 6 wherein the second user input comprises a volume up input, and wherein the controller is configured to further transmit via the wireless transmitter the second command to increase the volume output of the audio device when the volume up input is actuated.

8. A remote control according to claim 1 wherein the remote control further comprises a housing, and wherein the microphone is mounted to the housing adjacent the transmitter.

9. A remote control for automatically adjusting the volume output of an audio device, the remote control comprising:
   a wireless transmitter configured to selectively transmit command signals to the audio device;
   a microphone configured to monitor sound levels external to the remote control;
   a memory storing a first threshold and a second threshold different from the first threshold; and
   a controller configured to: (i) determine the signal level of the audio device as a function of at least two successive peaks in the sound levels monitored by the microphone, (ii) determine the noise level as a function of at least two successive troughs in the sound levels monitored by the microphone, (iii) transmit via the wireless transmitter a first command to decrease the volume output of the audio device if a ratio of the signal level to the noise level (the "signal-to-noise ratio") is greater than the first threshold, and (iv) transmit via the wireless transmitter a second command to increase the volume output of the audio device if the signal-to-noise ratio is less than the second threshold.

10. A remote control according to claim 9 further comprising a volume down button operatively coupled to the controller, the controller further configured to decrease the value of the first threshold and the value of the second threshold stored in the memory when the volume down button is depressed.

11. A remote control according to claim 10 further comprising a volume up button operatively coupled to the controller, the controller further configured to increase the value of the first threshold and the value of the second threshold stored in the memory when the volume up button is depressed.

12. A remote control according to claim 9 wherein the remote control further comprises a housing, and wherein the microphone is mounted to the housing adjacent the transmitter.

13. A method executable by a controller in a remote control for automatically adjusting the volume output of an audio device, the method comprising:
   storing a first threshold and a second threshold in a memory the first threshold is different from the second threshold;
   monitoring sound levels external to the remote control utilizing a single microphone;
   determining in the controller a signal-to-noise ratio as a function of the sound levels detected by the microphone;
   transmitting via a wireless transmitter a first command to decrease adjust the volume output of the audio device if the signal-to-noise ratio is greater than passes the first threshold;
   transmitting via a wireless transmitter a second command to increase the volume output of the audio device if the signal-to-noise ratio is less than the second threshold; and
   adjusting the value of the first and second thresholds, as stored in the memory, in response to actuation of at least one user input provided on the remote control.

14. A method according to claim 13 wherein the determining comprises:
   determining in the controller the signal level as a function of the average the minimum volume levels detected by the microphone over a given time period; and
   determining in the controller the noise level as a function of the average maximum volume levels detected by the microphone over a given time period.

15. A method according to claim 13 wherein the remote control further-comprises a volume down input and a volume up input coupled to the controller, and wherein adjusting comprises:
   decreasing the value of the first threshold and the value of the second threshold stored in the memory when the volume down input is actuated; and
   increasing the value of the first threshold and the value of the second threshold stored in the memory when the volume up input is actuated.

* * * * *